(12) United States Patent
Ametowobla et al.

(10) Patent No.: US 9,862,597 B2
(45) Date of Patent: Jan. 9, 2018

(54) LASER BEAM DEFLECTION FOR TARGETED ENERGY DEPOSITION

(71) Applicant: Robert Bosch GmbH, Stuttgart (DE)

(72) Inventors: Mawuli Ametowobla, Stuttgart (DE); Philip Kappe, Hildesheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/371,659

(22) Filed: Dec. 7, 2016

(65) Prior Publication Data

US 2017/0158499 A1 Jun. 8, 2017

(30) Foreign Application Priority Data

Dec. 8, 2015 (DE) .................. 10 2015 224 495

(51) Int. Cl.
*H01L 21/00* (2006.01)
*B81C 1/00* (2006.01)
(Continued)

(52) U.S. Cl.
CPC .......... *B81C 1/00325* (2013.01); *B23K 26/06* (2013.01); *B23K 26/064* (2015.10); *B23K 26/0622* (2015.10); *B23K 26/206* (2013.01); *B81B 7/0051* (2013.01); *H01L 23/04* (2013.01); *H01L 23/10* (2013.01); *B81B 2201/0235* (2013.01); *B81B 2201/0242* (2013.01); *B81C 2203/0145* (2013.01); *H01L 2924/1461* (2013.01); *H01L 2924/16152* (2013.01)

(58) Field of Classification Search
CPC ............. H01L 2924/1461; H01L 23/10; H01L 2924/16152; H01L 23/04
See application file for complete search history.

(56) References Cited

U.S. PATENT DOCUMENTS

2007/0089524 A1* 4/2007 Walchli ................ G01L 9/0079
73/718
2017/0113919 A1* 4/2017 Reichenbach ........ B81B 7/0035
(Continued)

FOREIGN PATENT DOCUMENTS

WO 2015/120939 A1 8/2015

*Primary Examiner* — Ngan Ngo
(74) *Attorney, Agent, or Firm* — Norton Rose Fulbright US LLP; Gerard Messina

(57) ABSTRACT

A method for manufacturing a micromechanical component having a substrate and having a cap connected to the substrate and enclosing with the substrate a first cavity is provided, a first pressure existing, and a first gas mixture having a first chemical composition being enclosed, in the first cavity, in a first method step an access opening that connects the first cavity to an environment of the micromechanical component being constituted in the substrate or in the cap, in a second method step the first pressure and/or the first chemical composition being established in the first cavity, in a third method step the access opening being sealed with the aid of a laser by the introduction of energy or heat into an absorbing portion of the substrate or of the cap, the introduction of energy or heat being controlled by spatial displacement of a laser beam along a path proceeding substantially parallel to a surface, facing away from the first cavity, of the substrate or of the cap.

13 Claims, 3 Drawing Sheets

(51) Int. Cl.
*B81B 7/00* (2006.01)
*B23K 26/20* (2014.01)
*B23K 26/06* (2014.01)
*B23K 26/0622* (2014.01)
*B23K 26/064* (2014.01)
*H01L 23/10* (2006.01)
*H01L 23/04* (2006.01)

(56) References Cited

U.S. PATENT DOCUMENTS

2017/0113920 A1\* 4/2017 Reichenbach ........ B81B 7/0048
2017/0113921 A1\* 4/2017 Breitling ............... B81B 7/0051
2017/0113923 A1\* 4/2017 Reichenbach ............ B81B 7/02
2017/0158498 A1\* 6/2017 Ametowobla ...... B81C 1/00325

\* cited by examiner

LASER BEAM DEFLECTION FOR TARGETED ENERGY DEPOSITION

FIELD OF THE INVENTION

The present invention relates to a method for manufacturing a micromechanical component.

BACKGROUND INFORMATION

In PCT Published Patent Application No. WO 2015/120939 A1, if a specific internal pressure in a cavity of a micromechanical component is desired, or if a gas mixture having a specific chemical composition is to be enclosed in the cavity, the internal pressure or the chemical composition is then often established upon capping of the micromechanical component or in the context of the bonding operation between a substrate wafer and a cap wafer. Upon capping, for example, a cap is connected to a substrate with the result that the cap and the substrate together enclose the cavity. The specific internal pressure and/or specific chemical composition in the cavity can thus be established by establishing the atmosphere or pressure, and/or the chemical composition, of the gas mixture present in the environment upon capping.

With the method known from PCT Published Patent Application No. WO 2015/120939 A1, an internal pressure in a cavity of a micromechanical component can be established in targeted fashion. It is possible with this method, in particular, to manufacture a micromechanical component having a first cavity, such that in the first cavity a first pressure and a first chemical composition, which differ at the time of capping from a second pressure and a second chemical composition, can be established in the first cavity.

In the method according to PCT Published Patent Application No. WO 2015/120939 A1 for targeted establishment of an internal pressure in a cavity of a micromechanical component, a narrow access channel to the cavity is generated respectively in the cap or in the cap wafer, or in the substrate or substrate wafer. The cavity is then flooded with the desired gas and the desired internal pressure via the access channel. Lastly, the region around the access channel is locally heated with the aid of a laser, and the substrate material locally liquefies and hermetically seals the access channel upon solidification.

SUMMARY

An object of the present invention is to furnish a method for manufacturing a micromechanical component, mechanically robust as compared with the existing art and exhibiting a long service life, in a manner that is simple and inexpensive as compared with the existing art. A further object of the present invention is to furnish a micromechanical component that, as compared with the existing art, is compact, mechanically robust, and exhibits a long service life. According to the present invention this applies in particular to a micromechanical component having a (first) cavity. It is moreover also possible, with the method according to the present invention and the component according to the present invention, to implement a micromechanical component in which a first pressure and a first chemical composition can be established in the first cavity, and a second pressure and a second chemical composition can be established in a second cavity. A method of this kind is provided, for example, for the manufacture of micromechanical components for which it is advantageous if a first pressure is enclosed in a first cavity and a second pressure in a second cavity, the first pressure being intended to differ from the second pressure. This is the case, for example, when a first sensor unit for rotation rate measurement and a second sensor unit for acceleration measurement are to be integrated into one micromechanical component.

The object is achieved by the fact that the introduction of energy or heat is controlled by spatial displacement of a laser beam along a path proceeding substantially parallel to a surface, facing away from the first cavity, of the substrate or of the cap.

The result is to furnish in simple and inexpensive fashion a method for manufacturing a micromechanical component with which the introduction of energy or heat is controllable by spatial displacement of a laser beam. The advantageous result thereof is that energy or heat can be introduced in spatially targeted fashion into the substrate or cap. On the basis of a spatial energy deposition distribution or heat distribution, and with the aid of heat distribution in the substrate or cap, it thus becomes possible to bring regions of the substrate or cap adjoining the material region, or adjoining the absorbing portion of the substrate or of the cap, to an elevated temperature as compared with the existing art. For example, the temperature gradients in the substrate or cap, in particular in the region of the access opening, are thus reduced as compared with the existing art. The result is that the thermal expansion (in the context of a temperature elevation) and/or thermal shrinkage (in the context of a temperature decrease) of adjacent regions in the substrate or in the cap, in particular in the region of the access opening, can be mutually equalized and the mechanical stresses occurring in the region of the sealed access opening can thus be reduced as compared with the existing art.

The method according to the present invention makes it possible in particular to reduce, as compared with the existing art, temperature gradients between the material region or welding spot that has only just solidified and the material surrounding the material region or the welding spot, by targeted elevation of the temperature in the material region or the material surrounding the welding spot. In particular, these temperature gradients can be reduced at the time of solidification of the welding spot or shortly after the welding spot has solidified. It is thus advantageously possible for the thermal shrinkage of the material region or of the welding spot to correspond substantially to the thermal shrinkage of the material surrounding the material region, or for the two thermal shrinkage values to be allowed to equalize with one another. The advantageous result is that the mechanical stresses occurring in the region of the sealed access opening, in particular after cooling of the material region, can be reduced as compared with the existing art.

A further advantage of the method according to the present invention is that the motion of dislocations is thermally activatable in targeted fashion with the aid of the targeted introduction of energy or heat into the substrate or into the cap, or with an energy distribution or heat distribution thus establishable in targeted fashion. It is thus advantageously possible that as a result of thermally activated dislocation motions or facilitated dislocation motions, the substrate or cap is plastically deformable at least in part or at least partially locally in the region of the access opening, in particular before a first transition of the material region from a solid aggregate state to a liquid aggregate state and/or after a second transition of the material region from a liquid aggregate state to a solid aggregate state. With the aid of the targeted introduction of energy or heat, stresses or stress peaks occurring locally due to plastic deformation can thus be reduced or dissipated as compared with the existing art.

The method according to the present invention is advantageous in particular as compared with methods in which a laser spot welding method is applied in the third method step, since with the method according to the present invention, stresses introduced into the material as a result of spot welds, locally in the region of the access opening or in the region of the sealed access opening, are avoided. The stresses occurring with the method according to the present invention are lower as compared with the stresses occurring as a result of spot welds, or advantageously can be better distributed in regions of the substrate or cap which are farther away from the access opening. Dissipation or reduction of locally occurring stresses is advantageous in particular because, as compared with the existing art, resistance to crack formation is elevated and the probability of component failure immediately after sealing of the access opening, during further processing of the micromechanical component, or during the product service life, can thus be decreased as compared with the existing art.

In connection with the present invention the "laser beam" is to be understood as electromagnetic radiation emitted continuously or non-continuously from a laser. The laser can be, for example, a pulsed laser or also a continuous wave laser. Provision is preferably made according to the present invention that the pulsed laser is operated in such a way that the electromagnetic radiation is emitted non-continuously over time or is incident non-continuously onto the absorbing portion of the substrate or cap or onto the path, but traverses the path in substantially spatially continuous fashion. "Traverses the path in substantially spatially continuous fashion" means according to the present invention that the electromagnetic radiation is absorbed in such a way that the absorbing portion of the substrate or cap encompasses the path, or that a projection of the entire track onto the surface is a subset of a projection of the absorbing portion of the substrate or cap onto the surface. Provision is furthermore made according to the present invention that the continuous wave laser is operated in such a way that the electromagnetic radiation is emitted continuously or is incident continuously onto the absorbing portion of the substrate or cap. Provision is furthermore made that the electromagnetic radiation is incident onto the absorbing portion of the substrate or cap and is at least partly absorbed thereby.

In connection with the present invention the term "micromechanical component" is to be understood in such a way that the term encompasses both micromechanical components and microelectromechanical components.

The present invention is provided preferably for, or for the manufacture of, a micromechanical component having one cavity. The present invention is also provided, however, for example for a micromechanical component having two cavities or having more than two, i.e. three, four, five, six, or more than six, cavities.

Preferably the access opening is sealed with the aid of a laser by introducing energy or heat into a portion of the substrate or cap which absorbs that energy or that heat. In this context, energy or heat is preferably introduced sequentially over time into the respective absorbing part of the substrate or cap of multiple micromechanical components that are manufactured, for example, together on one wafer. Provision is also alternatively made, however, for introduction of the energy or heat into the respective absorbing portion of the substrate or cap of multiple micromechanical components concurrently in time, for example using multiple laser beams or laser apparatuses.

According to a preferred refinement provision is made that the cap encloses with the substrate a second cavity, a second pressure existing, and a second gas mixture having a second chemical composition being enclosed, in the second cavity.

According to a preferred refinement provision is made that the introduction of energy or heat is controlled in such a way that the laser beam exhibits an electromagnetic wave having a substantially constant intensity over time or an electromagnetic wave having an intensity varying over time, in particularly having an intensity pulsing over time. The advantageous result thereof is that the method according to the present invention can be carried out both with continuous wave lasers and with pulsed lasers as a source of the laser beam.

According to a preferred refinement provision is made that the introduction of energy or heat is controlled in such a way that the path is a closed path. The advantageous result thereof is that a particularly uniform energy distribution or heat distribution can be generated in the substrate or cap.

According to a preferred refinement provision is made that the introduction of energy or heat is controlled in such a way that the path is an annular path. The advantageous result thereof is that a uniform energy distribution or heat distribution, adapted to the geometry of an annular access opening, can be generated in the substrate or cap.

According to a preferred refinement provision is made that the introduction of energy or heat is controlled in such a way that the path is disposed substantially rotationally symmetrically around the access opening. The advantageous result thereof is that the energy or heat can be introduced uniformly into a region of the substrate or cap around the access opening.

According to a preferred refinement provision is made that the introduction of energy or heat is controlled in such a way that the path is a spiral-shaped path, in particular in the shape of an Archimedean spiral, around a point, the point being disposed in the surface and inside a projection of the access opening onto the surface. The advantageous result thereof is that a particularly advantageous energy distribution or heat distribution can be generated in the region of the substrate or cap around the access opening. This makes possible in particular a gradual heating of the substrate or cap so that, particularly advantageously, temperature gradients in the substrate or cap can be minimized.

According to a preferred refinement provision is made that the laser beam is spatially displaced in such a way that the laser beam moves away from the point or that the laser beam moves toward the point. The advantageous result thereof is that either firstly a region of the substrate or cap directly at the access opening is gradually heated and then a region of the substrate or cap farther away from the access opening is gradually heated, or firstly the farther region is gradually heated and then the region disposed directly at the access opening is heated.

According to a preferred refinement provision is made that the introduction of energy or heat is controlled in such a way that the path is a line segment, a projection of the line segment onto the surface and a projection of the access opening onto the surface overlapping at least in part. The advantageous result thereof is that the substrate or cap is heated particularly efficiently in the region around the access opening.

According to a preferred refinement provision is made that the laser beam is spatially displaced in such a way that the line segment is traversed once or twice or three times or four times or five times or six times or seven times or eight times or nine times or ten times. The advantageous result thereof is that the substrate or cap in the region around the access opening is heatable particularly efficiently and nevertheless gradually.

A further subject of the present invention is an apparatus for carrying out a method according to the present invention, the apparatus encompassing a beam deflection system for spatial displacement of the laser beam, the beam deflection system encompassing a galvo scanner and/or an acousto-optic modulator and/or an electro-optic modulator and/or a resonant scanner and/or a piezo scanner and/or mechanically pivotable optical components and/or mechanically pivotable optical subassemblies, in particular wedge plates and/or lenses. The advantageous result thereof is that the laser beam can be displaced particularly quickly during the method according to the present invention.

DETAILED DESCRIPTION

Figure 1:
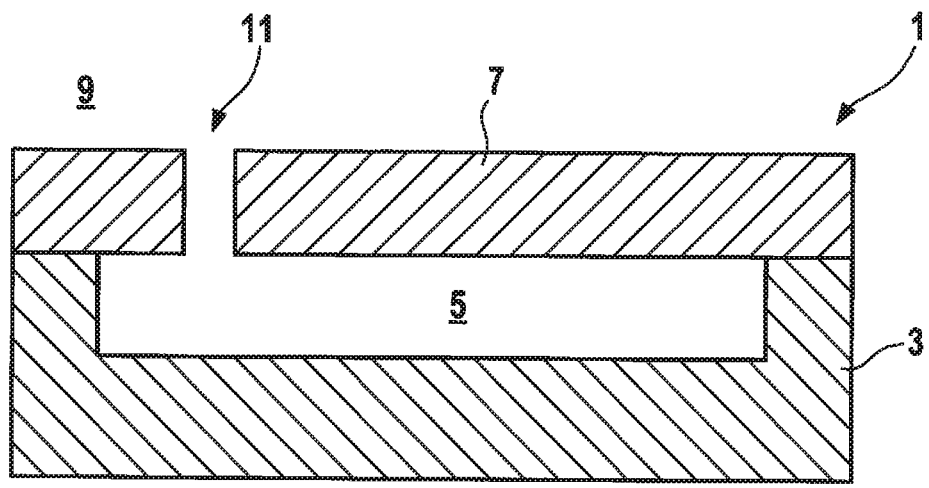
FIG. 1 schematically depicts a micromechanical component having an open access opening, according to an exemplifying embodiment of the present invention.

In the various Figures, identical parts are always labeled with the same reference characters and are therefore, as a rule, also each recited or mentioned only once.

Figure 2:
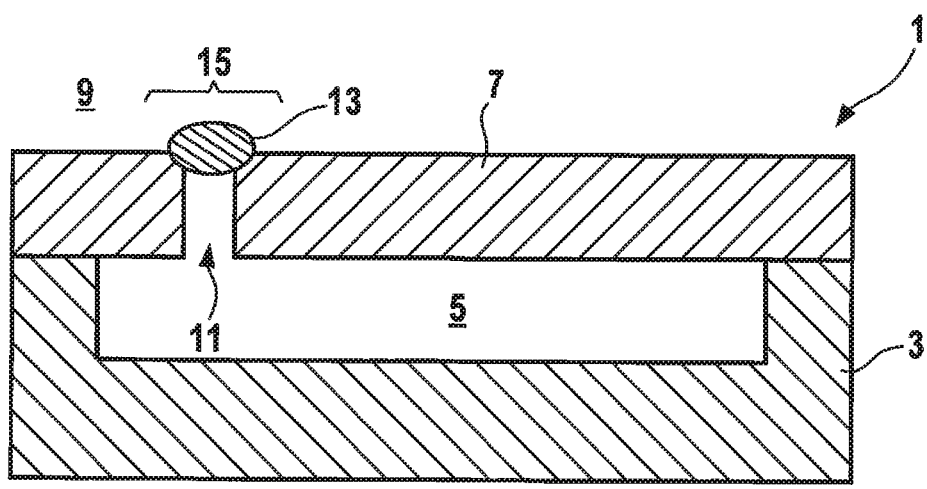
FIG. 2 schematically depicts the micromechanical component according to FIG. 1, with the access opening sealed.

FIG. 1 and FIG. 2 schematically depict a micromechanical component 1, having an open access opening 11 in FIG. 1 and having a sealed access opening 11 in FIG. 2, according to an exemplifying embodiment of the present invention. Micromechanical component 1 encompasses a substrate 3 and a cap 7. Substrate 3 and cap 7 are connected to one another, preferably hermetically, and together enclose a first cavity 5. Micromechanical component 1 is configured, for example, in such a way that in addition, substrate 3 and cap 7 together enclose a second cavity. The second cavity is not depicted, however, in FIG. 1 and FIG. 2.

A first pressure exists, for example, in first cavity 5, in particular when access opening 11 is sealed as depicted in FIG. 2. A first gas mixture having a first chemical composition is furthermore enclosed in first cavity 5. In addition, a second pressure exists, for example, in the second cavity, and a second gas mixture having a second chemical composition is enclosed in the second cavity. Access opening 11 is preferably disposed in substrate 3 or in cap 7. In the exemplifying embodiment present in this case, access opening 11 is disposed by way of example in cap 7. Alternatively thereto, however, provision can also be made according to the present invention that access opening 11 is disposed in substrate 3.

Provision is made, for example, that the first pressure in first cavity 5 is lower than the second pressure in the second cavity. Provision is also made, for example, that a first micromechanical sensor unit (not depicted in FIG. 1 and FIG. 2) for rotation rate measurement is disposed in first cavity 5, and a second micromechanical sensor unit (not depicted) for acceleration measurement is disposed in the second cavity.

Figure 3:
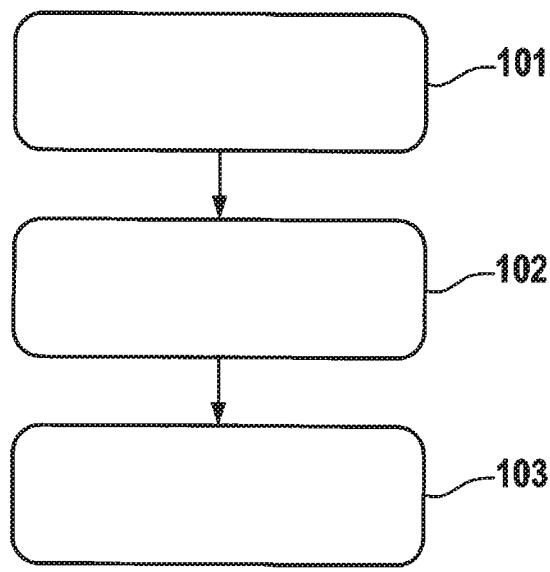
FIG. 3 schematically depicts a method for manufacturing a micromechanical component, according to an exemplifying embodiment of the present invention.

FIG. 3 schematically depicts a method for manufacturing micromechanical component 1, according to an exemplifying embodiment of the present invention. In this context:

in a first method step 101, the (in particular, narrow) access opening 11 connecting first cavity 5 to an environment 9 of micromechanical component 1 is configured in substrate 3 or in cap 7. FIG. 1 shows, by way of example, micromechanical component 1 after the first method step 101. In addition, in a second method step 102, the first pressure and/or the first chemical composition are established in first cavity 5, or first cavity 5 is flooded via the access channel with the desired gas and the desired internal pressure. Furthermore, for example, in a third method step 103, access opening 11 is sealed with the aid of a laser by introducing energy or heat into an absorbing portion of substrate 3 or of cap 7. Provision is also made alternatively, for example, that in the third method step 103, the region around the access channel is only locally heated, preferably by a laser, and the access channel is hermetically sealed. It is thus advantageously possible also to provide the method according to the present invention using energy sources other than a laser for sealing access opening 11. FIG. 2, by way of example, shows micromechanical component 1 after the third method step 103.

After the third method step 103, mechanical stresses can occur in a lateral region 15 depicted by way of example in FIG. 2, on a surface of cap 7 facing away from cavity 5 and depthwise perpendicularly to a projection of lateral region 15 onto the surface, i.e. along access opening 11 and toward first cavity 5 of micromechanical component 1. These mechanical stresses, in particular local mechanical stresses, exist in particular at and in the vicinity of an interface between a material region 13 of cap 7 which transitions in the third method step 103 into a liquid aggregate state and transitions after the third method step 103 into a solid aggregate state, and which seals access opening 11, and a residual region of cap 7 which remains in a solid aggregate state during the third method step 103. In FIG. 2, material region 13 of cap 7 which seals access opening 11 is to be regarded as merely schematic or schematically depicted, in particular with regard to its lateral extent or conformation, in particular proceeding parallel to the surface, and in particular with regard to its extension or configuration proceeding perpendicularly to the lateral extent, in particular perpendicularly to the surface.

Provision is made, for example, that the first method step is carried out before the bonding of the substrate and of the cap. The advantageous result thereof is that the access opening is already in an open state during bonding.

Provision is made, for example, that the introduction of energy or heat is controlled by spatial displacement of a laser beam along a path 1103 proceeding substantially parallel to a surface 1101, facing away from first cavity 5, of substrate 3 or of cap 7. Provision is made, for example, that the spatial displacement of the laser beam is carried out with the aid of in situ laser beam guidance. Provision is made in this context, for example, that in the third method step 103, the region around access opening 11 becomes locally heated by one or more laser pulses, and access opening 11 becomes hermetically sealed. For example, the laser beam is displaced by a fast deflection system, during the laser pulse or pulses, in a controlled figure around the vent hole or access opening 11. The laser beam is thereby spatially displaced, for example, in a manner that is advantageous in contrast to the existing art, in order to generate a defined energy deposition distribution during the process. A more advantageous stress state in the material is thereby achieved as compared with a static method.

According to the present invention provision is made, for example, that the introduction of energy or heat is carried out within a time span of 0.1 µs to 10 ms, preferably within a time span of 1 µs to 1 ms, particularly preferably within a time span of 10 µs to 500 µs.

FIG. 4, FIG. 5, FIG. 6, FIG. 7, and FIG. 8 schematically depict paths 1103 proceeding substantially parallel to a surface, facing away from first cavity 5, of substrate 3 or of cap 7. Provision is made, for example, that the introduction of energy or heat is controlled in such a way that the laser beam exhibits an electromagnetic wave having a substantially constant intensity over time or an electromagnetic wave having an intensity varying over time, in particular having an intensity pulsing over time.

Figure 4:
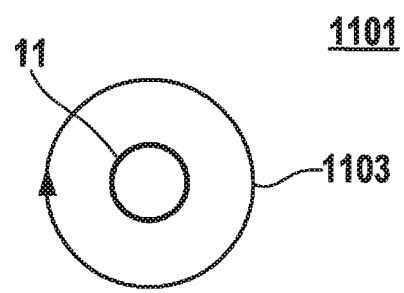
FIGS. 4-8 schematically depict paths proceeding substantially parallel to a surface, facing away from the first cavity, of the substrate or cap.

FIG. 4 shows by way of example that the introduction of energy or heat is controlled in such a way that path 1103 is a closed path. FIG. 4 illustrates, by way of example, that path 1103 is an annular path. In other words, FIG. 4 depicts a path 1103 in the form of a ring around the vent hole to be sealed or around the access opening to be sealed. Provision is made, for example, that the path depicted in FIG. 4 is traversed several times with the laser beam. Provision is made in this context, for example, that the laser beam is spatially displaced in such a way that the laser beam makes several, in particular two or three or four or five or six or seven or eight or nine or ten, passes along the path.

Alternatively, however, provision is also made, for example, that path 1103 depicted in FIG. 4 is a right-angled path, for example in the form of a rectangle. Alternatively, however, provision is also made, for example, that path 1103 is a path having angles of 10° and/or 20° and/or 30° and/or 40° and/or 45° and/or 50° and/or 60° and/or 70° and/or 80° and/or 100° and/or 110° and/or 120° and/or 130° and/or 135° and/or 140° and/or 150° and/or 160° and/or 170°.

Provision is also made, for example, as depicted in FIG. 4, that the introduction of energy or heat is controlled in such a way that path 1103 is disposed substantially rotationally symmetrically around access opening 11. Provision is also made, for example, that the center of mass or geometric center of the path substantially coincides with a longitudinal axis of access opening 11.

Figure 5:
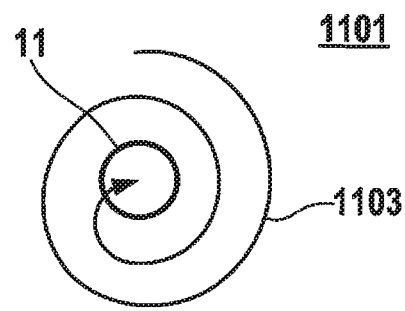
Figure 6:
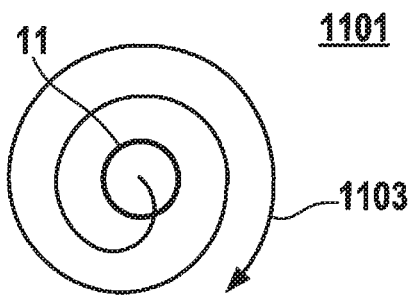

FIG. 5 and FIG. 6 furthermore show by way of example that path 1103 is a spiral-shaped path, in particular in the shape of an Archimedean spiral, around a point. The point is disposed, by way of example, in surface 1101 and inside a projection of access opening 11 onto surface 1101. FIG. 5 shows by way of example that the laser beam is spatially displaced in such a way that the laser beam moves toward the point. In other words, FIG. 5 depicts by way of example a spiral that begins on the outside and ends at or in the vicinity of the vent hole to be sealed or of access opening 11 that is to be sealed. FIG. 6 alternatively shows, by way of example, that the laser beam is spatially displaced in such a way that the laser beam moves away from the point. In other words, FIG. 6 depicts by way of example a spiral that begins at or in the vicinity of the vent hole to be sealed or access opening 11 that is to be sealed, and circles the access opening and moves away from access opening 11.

Figure 7:
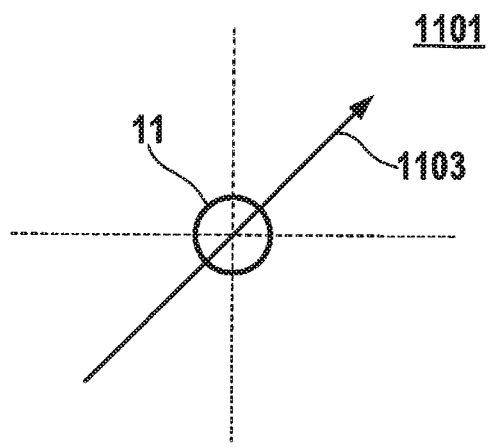

FIG. 7 also shows by way of example that path 1103 is a line segment, a projection of the line segment onto surface 1101 and a projection of access opening 11 onto surface 1101 overlapping at least in part. In other words, FIG. 7 depicts a linear path 1103, stress vectors being oriented along advantageous crystal orientations as a result of a linear motion of the laser beam.

Figure 8:
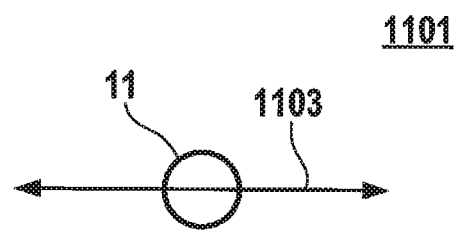

Lastly, FIG. 8 shows by way of example that the laser beam is spatially displaced in such a way that the line segment is traversed once or twice or three times or four times or five times or six times or seven times or eight times or nine times or ten times. Provision is made, for example, that the first traverse is carried out in a first direction and the second traverse in a second direction opposite to the first direction. Provision is additionally made, for example, that the third, fifth, seventh, and ninth traverse are carried out in the first direction. Provision is also made, for example, that the fourth, sixth, eighth, and tenth traverse are carried out in the second direction. Provision is furthermore made, for example, that the line segment is traversed a plurality of further times. Provision is made in this context, for example, that the traverses are carried out successively in time, alternately in the first direction and in the second direction. In other words, FIG. 8 shows a wobbling of the laser beam, the laser beam being moved quickly back and forth over the vent hole to be sealed or over access opening 11 that is to be sealed. "Quickly" means, in connection with the present invention, that the back-and-forth motion is carried out within a time span of 1 µs to 100 ms, in particular within a time span of 10 µs to 500 µs.

Also in accordance with the present invention is an apparatus for carrying out a method according to the present invention, the apparatus encompassing a beam deflection system for spatial displacement of the laser beam, the beam deflection system encompassing a galvo scanner and/or an acousto-optic modulator and/or an electro-optic modulator and/or a resonant scanner and/or a piezo scanner and/or mechanically pivotable optical components and/or mechanically pivotable optical subassemblies, in particular wedge plates and/or lenses. The advantageous result thereof is that the laser beam can be displaced particularly quickly during the method according to the present invention. The result thereof is in particular that the laser beam can be moved once or several times along paths 1103 depicted by way of example in FIG. 4, FIG. 5, FIG. 6, FIG. 7, and FIG. 8, in particular within a time span of 0.1 µs to 10 ms, preferably within a time span of 1 µs to 1 ms, particularly preferably within a time span of 10 µs to 500 ms. In particular thanks to the use in the beam deflection system of several of the components recited above, for example a galvo scanner and/or an acousto-optic modulator and/or an electro-optic modulator and/or a resonant scanner and/or a piezo scanner and/or mechanically pivotable optical components and/or mechanically pivotable optical subassemblies, several laser beams can, for example, advantageously be made available. In addition, the correspondingly preferred component can advantageously be selected for the particular laser beam being used or for the particular path 1103 being used.

What is claimed is:

1. A method for manufacturing a micromechanical component having a substrate and a cap connected to the substrate and enclosing with the substrate a first cavity, a first pressure existing, and a first gas mixture having a first chemical composition being enclosed, in the first cavity, the method comprising:

in a first method step, constituting, in one of the substrate and the cap, an access opening that connects the first cavity to an environment of the micromechanical component;

in a second method step, establishing at least one of the first pressure and the first chemical composition in the first cavity; and in a third method step, sealing the access opening with the aid of a laser by the introduction of one of energy and heat into an absorbing portion of one of the substrate and the cap, wherein the introduction of one of energy and heat is controlled by a spatial displacement of a laser beam along a path proceeding substantially parallel to a surface, facing away from the first cavity, of one of the substrate and the cap.

2. The method as recited in claim 1, wherein the introduction of one of energy and heat is controlled in such a way that the laser beam exhibits one of an electromagnetic wave having a substantially constant intensity over time and an electromagnetic wave having an intensity varying over time.

3. The method as recited in claim 2, wherein the varying intensity pulses over time.

4. The method as recited in claim 1, wherein the introduction of one energy and heat is controlled in such a way that the path is a closed path.

5. The method as recited in claim 1, wherein the introduction of one of energy and heat is controlled in such a way that the path is an annular path.

6. The method as recited in claim 1, wherein the introduction of one of energy and heat is controlled in such a way that the path is disposed substantially rotationally symmetrically around the access opening.

7. The method as recited in claim 1, wherein the introduction of one of energy and heat is controlled in such a way that the path is a spiral-shaped path around a point disposed in the surface and inside a projection of the access opening onto the surface.

8. The method as recited in claim 7, wherein the spiral-shaped path is in the shape of an Archimedean spiral.

9. The method as recited in claim 7, wherein the laser beam being is spatially displaced in such a way that the laser beam one of moves away from the point moves toward the point.

10. The method as recited in claim 1, wherein the introduction of one of energy and heat is controlled in such a way that the path is a line segment, a projection of the line segment onto the surface and a projection of the access opening onto the surface overlapping at least in part.

11. The method as recited in claim 1, wherein the laser beam is spatially displaced in such a way that the line segment is traversed between one and ten times, inclusively.

12. An apparatus for carrying out a method for manufacturing a micromechanical component having a substrate and a cap connected to the substrate and enclosing with the substrate a first cavity, a first pressure existing, and a first gas mixture having a first chemical composition being enclosed, in the first cavity, the method including, in a first method step, constituting, in one of the substrate and the cap, an access opening that connects the first cavity to an environment of the micromechanical component, in a second method step, establishing at least one of the first pressure and the first chemical composition in the first cavity, and in a third method step, sealing the access opening with the aid of a laser by the introduction of one of energy and heat into an absorbing portion of one of the substrate and the cap, wherein the introduction of one of energy and heat is controlled by a spatial displacement of a laser beam along a path proceeding substantially parallel to a surface, facing away from the first cavity, of one of the substrate and the cap, the apparatus comprising:

a beam deflection system for spatial displacement of the laser beam, the beam deflection system including at least one of:
a galvo scanner,
an acousto-optic modulator,
an electro-optic modulator,
a resonant scanner,
a piezo scanner,
mechanically pivotable optical components, and
mechanically pivotable optical subassemblies.

13. The apparatus as recited in claim 12, wherein the mechanically pivotable optical subassemblies include at least one of wedge plates and lenses.

* * * * *